(12) United States Patent
LaBerge

(10) Patent No.: US 6,876,589 B2
(45) Date of Patent: Apr. 5, 2005

(54) METHOD AND APPARATUS FOR SUPPLEMENTARY COMMAND BUS

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/708,751

(22) Filed: Mar. 23, 2004

(65) Prior Publication Data

US 2004/0170071 A1 Sep. 2, 2004

Related U.S. Application Data

(63) Continuation of application No. 10/073,740, filed on Feb. 11, 2002, now Pat. No. 6,728,150.

(51) Int. Cl.$^7$ ................................................. G11C 7/00
(52) U.S. Cl. ................................. 365/200; 365/189.03
(58) Field of Search ........................... 365/200, 189.03, 365/189.01, 191

(56) References Cited

U.S. PATENT DOCUMENTS

| | | | |
|---|---|---|---|
| 4,426,644 A | | 1/1984 | Neumann et al. |
| 5,319,753 A | * | 6/1994 | MacKenna et al. ........... 710/48 |
| 5,721,860 A | | 2/1998 | Stolt et al. |
| 5,748,551 A | | 5/1998 | Ryan et al. |
| 5,831,924 A | | 11/1998 | Nitta et al. |
| 6,230,235 B1 | | 5/2001 | Lu et al. |

* cited by examiner

Primary Examiner—Thong Q. Le
(74) Attorney, Agent, or Firm—Snell & Wilmer L.L.P.

(57) ABSTRACT

An electronic system according to various aspects of the present invention includes a memory having a location-specific command interface and a general command interface. The memory communicates with other components in the system via a main command bus configured to transfer address-specific commands and a supplementary command bus configured to transfer general commands. Commands may be received by the memory simultaneously at the respective interfaces.

26 Claims, 6 Drawing Sheets

METHOD AND APPARATUS FOR SUPPLEMENTARY COMMAND BUS

CROSS REFERENCE TO RELATED APPLICATIONS

This application claims the benefit of and is a continuation of application Ser. No. 10/073,740 filed in the United States Patent and Trademark Office by Paul A. LaBerge on Feb. 11, 2002 now U.S. Pat. No. 6,728,150.

FIELD OF INVENTION

The invention relates to integrated circuits and semiconductor systems, and more particularly, to accessing data.

BACKGROUND OF INVENTION

Many electronic systems use memory to store information. Memory devices include an interface to communicate with other elements of the system. An ordinary interface provides several inputs and outputs, including various bus connections to accommodate multi-bit transfers in parallel. In particular, memory devices typically include a command bus and an address bus that transmit command and address information from a controller to the memory device.

For example, many existing DRAM devices include a command/address bus having three command signals, ordinarily row address strobe (RAS), column address strobe (CAS), and write enable (WE), and several address signals, including row/column address (A[X:0]), bank address (BA [1:0]), and chip select (CS). The command signals decode yielding several commands, such as ACTIVATE ROW, COLUMN SELECT with WRITE/READ, PRECHARGE ROW, PRECHARGE ALL, AUTO REFRESH, SELF REFRESH, WAKE, LOAD MODE, and LOAD EXTENDED MODE.

Certain access processes saturate the command/address bus, limiting the throughput/bandwidth of the memory device. For example, referring to FIG. 9 illustrating a simplified memory access process, if the addressing patterns dictate all page misses, each burst transfer operation 900 of data to/from the memory devices requires one ACTIVATE command 910 for the row address 911 and one READ or WRITE command 912 corresponding to the column address data 913. Bank selection data is transferred via a bank selection bus 924. A PRECHARGE command 914 for the selected bank 915 is then asserted to close the selected bank. If the burst size does not allow time for three commands, however, the data transfer rate is throttled. A common example is a burst size of four data bus transfers 916A–D with the data bus 920 running at double the rate of the command/address bus 922. This is a simplified, illustrative example, for memory accesses typically utilize interleaved commands to the various banks to optimize the operation of the memory system, but it serves to illustrate that each data bus burst transfer operation 900 provides two command/address slots 910, 912. Because three commands are required to effect the transfer, however, the data bus efficiency may be reduced to two-thirds of its capacity.

SUMMARY OF INVENTION

An electronic system according to various aspects of the present invention includes a memory having a location-specific command interface and a general command interface. The memory communicates with other components in the system via a main command bus configured to transfer address-specific commands and a supplementary command bus configured to transfer general commands. Commands may be received by the memory simultaneously at the respective interfaces. For example, a PRECHARGE command may be received on the general command interface while a memory access is received on the location-specific interface.

BRIEF DESCRIPTION OF DRAWINGS

A more complete understanding of the present invention may be derived by referring to the detailed description and claims when considered in connection with the following illustrative Figures, which may not be to scale. In the following Figures, like reference numbers refer to similar elements throughout the Figures.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention may be described in terms of functional block components and various processing steps. Such functional blocks may be realized by any number of hardware and software components configured to perform specified functions. For example, the present invention may employ various components, e.g., memory elements, interface elements, logic elements, buses, package connections, and the like, which may carry out a variety of functions under the control of one or more processors or other control devices. In addition, the present invention may be practiced in conjunction with any number of storage systems and data transmission media and protocols and the systems described are merely exemplary applications of the invention. Further, the present invention may employ any number of conventional techniques for data transmission, signaling, data processing, bus control, and the like.

Figure 1:
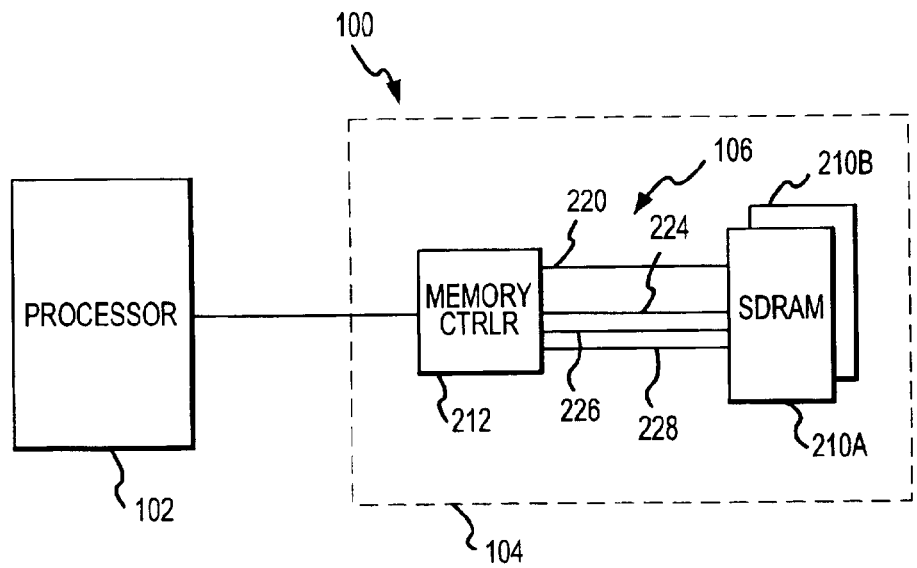
FIG. 1 is a block diagram of an electronic system according to various aspects of the present invention.

Referring to FIG. 1, an electronic system 100 according to various aspects of the present invention may include a processor 102 and a memory system 104. The present electronic system 100 comprises a system using a memory, such as a personal computer system. The electronic system 100 may comprise, however, any suitable electronic system, such as a communication system, computing system, entertainment system, control system, portable electronic device, audio component, appliance, or factory control system, and the various components may differ according to the particular system and environment. The processor 102 generally controls operation of the electronic system 100, and may comprise any appropriate processor or controller, such as an Intel, Motorola, or Advanced Micro Devices microprocessor. In some applications, the processor 102 may be replaced by other devices, such as logic circuits or ASICs, or omitted altogether.

The memory system 104 comprises a storage system for storing data. The memory system 104 may comprise any appropriate memory system for storing data and transferring data between the memory system 104 and the processor 102 or another component. In the present embodiment, the memory system 104 includes one or more memory modules 210A, B, a memory controller 212, and a bus system 106. The memory controller 212 controls access to, including data transfers to and from, the memory modules 210, and may perform further functions and operations as well. The memory controller 212 may comprise any suitable memory controller for controlling access to the memory modules 210. In some embodiments, the memory controller 212 may be omitted and/or have its functions performed by other system components.

The memory modules 210 may comprise any system for storing data, such as a ROM, SRAM, DRAM, SDRAM, or any other suitable storage system. In the present embodiment, the memory modules 210 comprise double data rate synchronous dynamic random access memory (DDR SDRAM) modules from Micron. For example, each memory module 210 suitably comprises a high-speed CMOS SDRAM internally configured as four banks of DRAMs. The memory modules 210, however, may comprise any appropriate memory or configuration, such as an individual memory chip, a multi-component device, or another type of storage device altogether. The memory modules 210 interface with the rest of the electronic system 100 through any suitable interface, such as a plurality of connections comprising pins, solder, conductive connections, optical couplings, or any other suitable coupling.

The bus system 106 connects the components of the memory system 104. The memory system 104, including the bus system 106, may utilize any appropriate signals, including optical or electric signals. The bus system 106 may comprise any suitable medium for transferring information, such as a plurality of wires, optical fibers, or other communication medium. In the present embodiment, the medium comprises an electronic bus, such as a serial bus or multi-bit bus, to which the memory system 104 and other components may be attached.

Communications with the memory system 104 may be controlled in any suitable manner and by any suitable component, such as using the processor 102, the memory controller 212, or other circuit or system to control communications. In the present embodiment, communications with the memory module 210 are suitably controlled by the memory controller 212.

Figure 2:
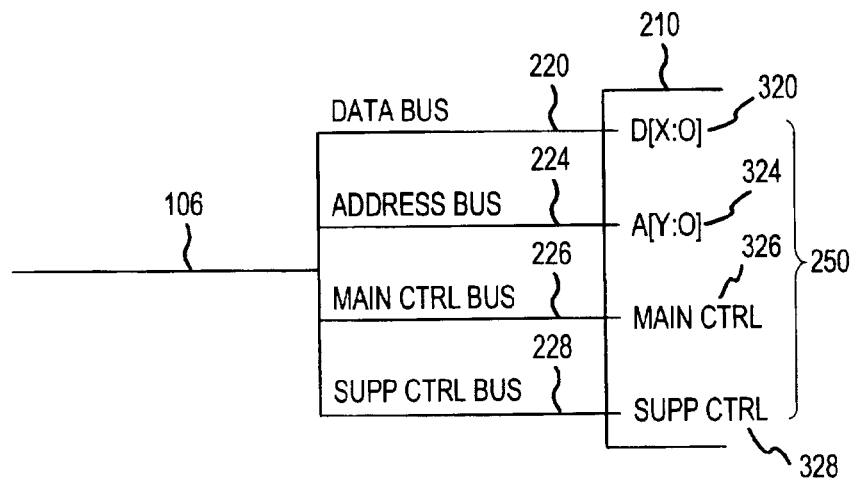
FIG. 2 is a block diagram of a memory interface and a bus system.

The bus 106 and the connected components may communicate using any appropriate communication techniques and/or protocols. For example, the components may communicate via the bus 106 using a selected conventional protocol, such as those described in specifications for Micron SDRAMs. The bus 106 is also suitably configured to communicate with the memory modules 210. For example, referring to FIG. 2, each memory module 210 includes an interface 250 having a data bus connection 320, address bus connection 324, main command bus connection 326, and supplementary command bus connection 328. The bus 106 may be configured accordingly to facilitate communication, such as including a data bus 220, an address bus 224, a main control bus 226, and a supplementary control bus 228.

The memory interface 250 and the bus 106 provide one or more media for transferring information to and from the memory module 210. Each bus component 220, 224, 226, 228 ordinarily transfers a selected type of information, i.e., address selection information on the address bus 224, data on the data bus 220, and command signals on the main control bus 226 and the supplementary control bus 228. Further, each bus may be suitably configured to transfer the relevant information. For example, each bus may be configured to handle a selected number of bits.

More particularly, the data bus interface 320 of the present embodiment comprises a multibit, such as 4-, 8-, or 16-bit, connection for transferring information to and from the data bus 220. The address bus interface 324 of the present embodiment comprises a 13-bit connection for, among other things, receiving row and column address information to select one location out of the memory array 210 in a selected bank. The data bus 220 and address bus 224 are suitably configured to interface with the memory module 210 via the corresponding interfaces 320, 324.

Signals on the main control bus 226 and the supplementary control bus 228 define commands, and may further identify the chips and/or banks to which the commands apply. The commands may be any set of commands for operation of the memory module 210. In the present embodiment, the supplementary control bus 228 is used to provide a first selected subset of commands and the main control bus 226 to provide a second selected subset or, alternatively, the entire set of commands. For example, the supplementary control bus 228 may be used for general commands, i.e., commands that relate to large blocks of memory locations (like the entire module or an entire bank). The main control bus 226 handles location-specific commands, i.e., that relate to specific individual locations or groups of locations in the memory module 210, as well as other commands in various embodiments. The memory location relating to the location-specific command may be indicated in any suitable manner, such as by signals on the address bus 224. Thus, the main control bus 226 is used for commands using row and/or column information, typically provided via the address bus 224, and the supplementary control bus 228 is used for commands that are not associated with row or column information, and thus do not utilize the address bus 224.

Figure 3:
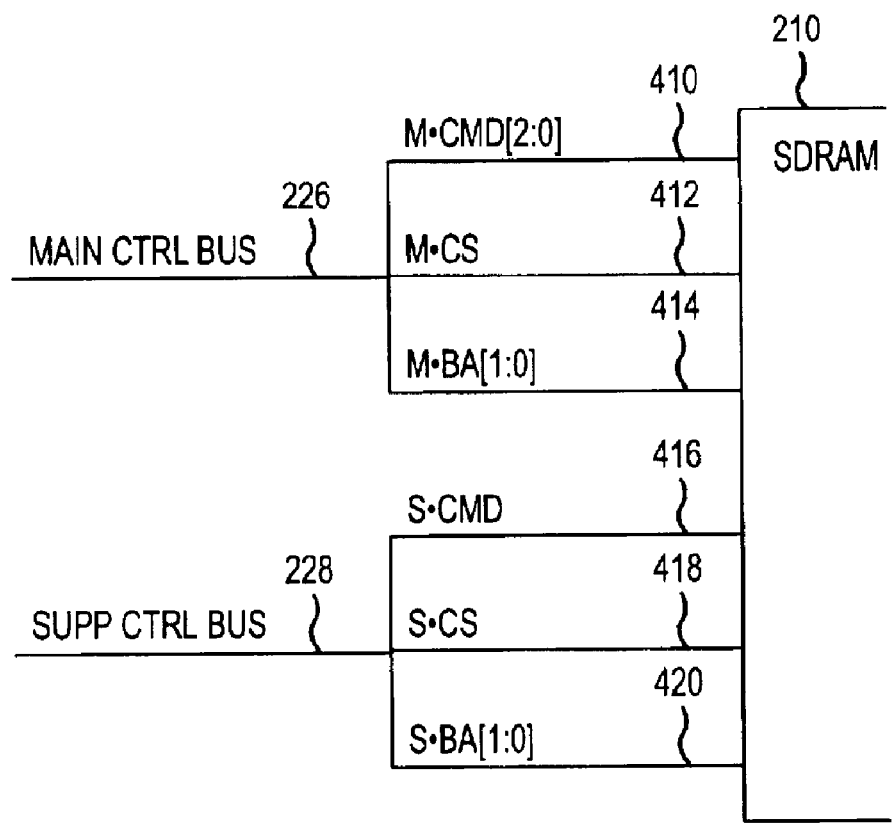
FIG. 3 is a block diagram of a main control bus and a supplementary control bus.

Command signals may be divided between the main control bus 226 and the supplementary control bus 228 in any suitable manner; similarly, the main control bus 226 and the supplementary control bus 228 may be configured in any suitable manner to accommodate the command signals. For example, in one embodiment illustrated in FIG. 3, the main control bus 226 comprises a main command bus 410 having three main command bits (M-CMD), a main chip select bus bit 412 having one bit (M-CS), and a main bank selection bus 414 having two bits (M-BA). The three main command bits are suitably designated as a row address strobe (RAS), a column address strobe (CAS), and a write enable (WE). In the present embodiment, the main bank selection bus 414 comprises a two-bit bus which defines the bank to which a command is to be applied, and the one-bit main chip select bus 412 identifies the relevant chip for the corresponding operation.

Similarly, the supplementary control bus 228 may be configured in any suitable manner to accommodate the relevant command set. For example, the supplementary control bus 228 suitably comprises a supplementary command bus 416 (S-CMD), a supplementary chip select bus 418 (S-CS), and a supplementary bank selection bus 420 (S-BA). In one embodiment, the supplementary control bus 228 solely facilitates PRECHARGE operations. PRECHARGE operations may comprise operations to deactivate open rows in a particular bank or all banks of the memory, though the PRECHARGE operation may comprise any appropriate process for preparing a memory or portion of memory for access or restoring a memory to a selected state following an access.

In the present dedicated PRECHARGE embodiment, the supplementary command bus 416 is a one-bit signal such that assertion of the supplementary command bit signals the memory module 210 to execute a PRECHARGE command on the bank 310A indicated by the supplementary chip select bus 418 and supplementary bank selection bus 420. Alternatively, because PRECHARGE is the only command controlled by the supplementary control bus 228, the supplementary command bus 416 may be omitted altogether, so that the supplementary chip select bus operates as the PRECHARGE signal. Activation of the supplementary chip select causes a PRECHARGE operation on the indicated chip in the bank designated by the supplementary bank selection bus 420.

Thus, the ACTIVE and subsequent READ or WRITE commands may be asserted using the main control bus 226 in conjunction with the address bus 224 to retrieve or store data. The next ACTIVE command or other command may then be asserted via the main control bus 226 on another bank 210B concurrently with assertion of a PRECHARGE command on the original bank 210A via the supplementary control bus 228. Accordingly, the PRECHARGE commands may be asserted without using the main control bus 226, thus relieving congestion on the main control bus 226 and tending to improve the performance of the memory module 210.

Figure 4:
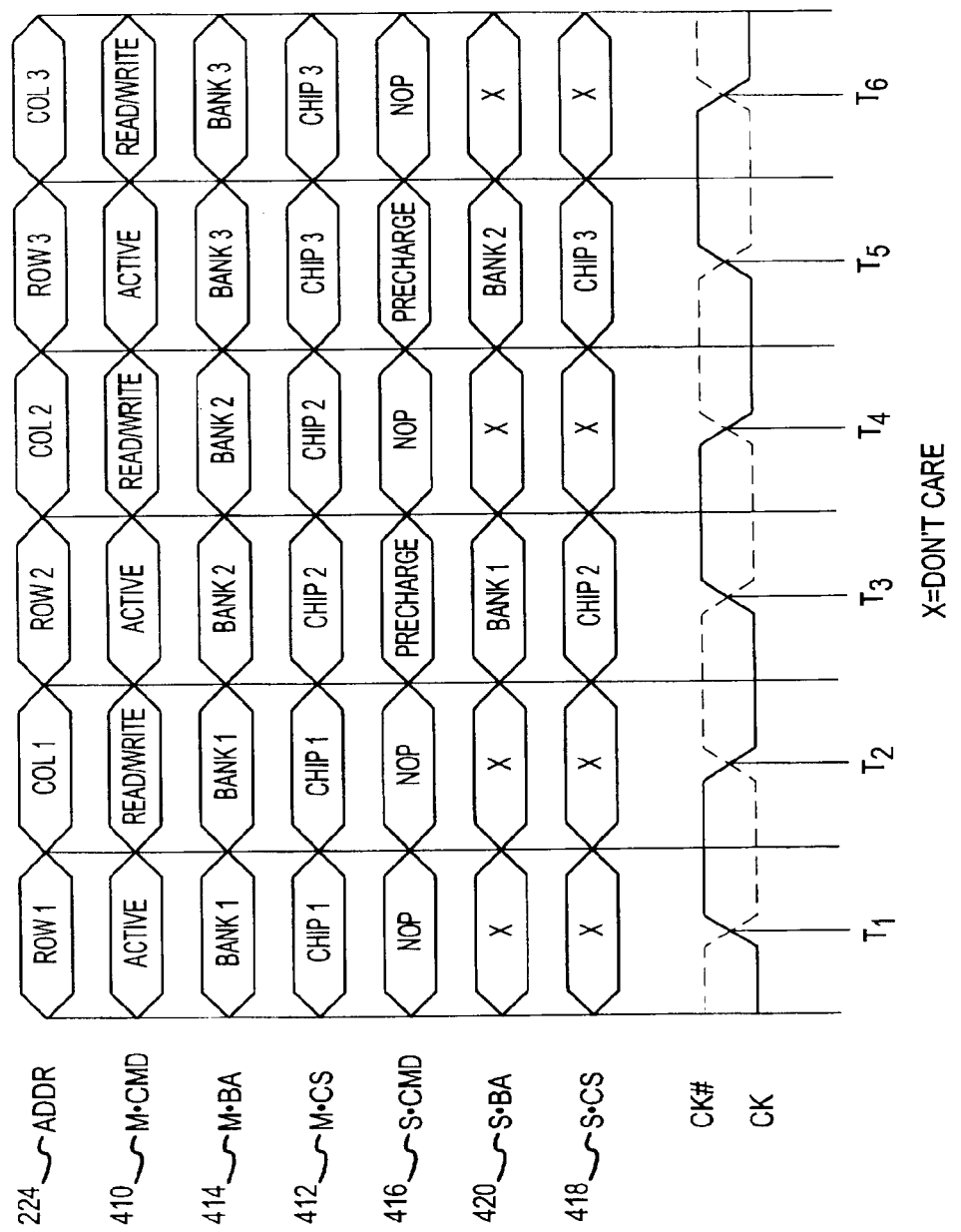
FIG. 4 is a timing diagram for consecutive memory accesses.

More particularly, an electronic system 100 and method according to various aspects of the present invention may use the main control bus 226 to activate rows and select columns for memory access operations and the supplementary control bus 228 to close banks of memory. For example, referring to FIG. 4, an initial memory access may be performed by identifying the relevant bank on the main bank selection bus 414, the relevant chip on the main chip select bus 412, and the relevant memory row on the address bus 224, and providing the ACTIVE signal on the main command bus 410 at a first time T1. At substantially the same time, the supplementary control bus 228 receives a NOP command to prevent any unwanted command from being registered on the supplementary control bus 228.

Following the initial memory access, a second memory access operation may be initiated at a second memory location on a different bank. Accordingly, the second memory location may be identified on the main chip select bus 412, main bank select bus 414, and address bus 224, and the ACTIVE and READ or WRITE commands may be successively provided via the main command bus 410 at times T3 and T4. Meanwhile, the supplementary control bus 228 may provide a PRECHARGE command to a previously accessed bank to close the still-active row from the preceding memory access operation. For example, the previously accessed bank and chip are identified on the supplementary bank selection bus 420 and supplementary chip select bus 418, respectively, at time T3. The PRECHARGE command is provided on the supplementary command bus 416 to initiate the precharge of the previously accessed bank while the second bank is being accessed via the main control bus 226.

The command set may be apportioned and/or shared by the main control bus 226 and the supplementary control bus 228 in any suitable manner. For example, the commands may be shared such that all of the commands requiring the address bus 224 are asserted via the main control bus 226, and all of the commands that do not require the address bus 224 may be asserted via either the supplementary control bus 228 or the main control bus 226. Thus, the device providing the commands, such as the memory controller 212, may select which control bus 226, 228 on which to provide a command according to any selected criteria. Alternatively, the commands may be restricted to assertion on either the main control bus 226 or the supplementary control bus 228, or the commands may be apportioned such that one set of commands is asserted only on the main control bus 226, a second set is asserted only on the supplementary control bus 228, while a third set may be asserted on either bus 226, 228.

Figure 5:
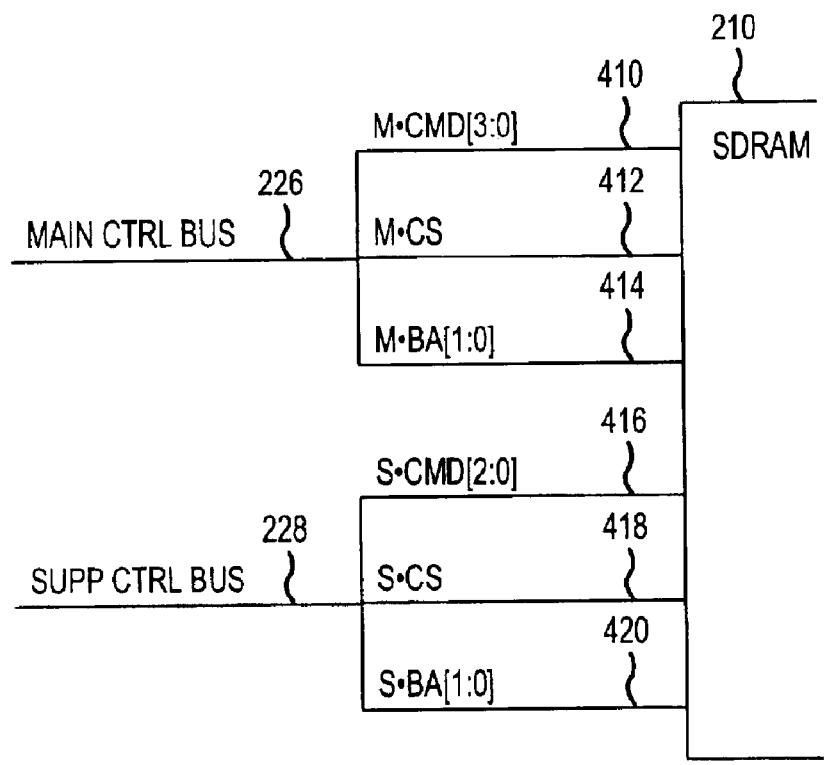
FIG. 5 is a block diagram of an alternative embodiment of a main control bus and a supplementary control bus.

Similarly, memory module interface 250, the main control bus 226, and the supplementary control bus 228 may be configured in any suitable manner to facilitate assertion of the commands as apportioned or shared. In the embodiment in which all commands not requiring the address bus 224 may be asserted on either the main control bus 226 or the supplementary control bus 228, the respective control buses 226, 228 are suitably configured with sufficient bits to accommodate the relevant command set. For example, referring to FIG. 5, the memory module 210 may accommodate nine commands such that three commands require the address bus 224 (such as ACTIVE, READ, and WRITE) and six commands do not (such as DESELECT, NO OPERATION, BURST TERMINATE, PRECHARGE, AUTO REFRESH, and LOAD MODE REGISTER). To accommodate all nine commands, the main control bus 226 may be configured with four command bits. Similarly, the supplementary control bus 228 is suitably configured with three command bits to accommodate the six commands that do not use the address bus 224.

Figure 6:
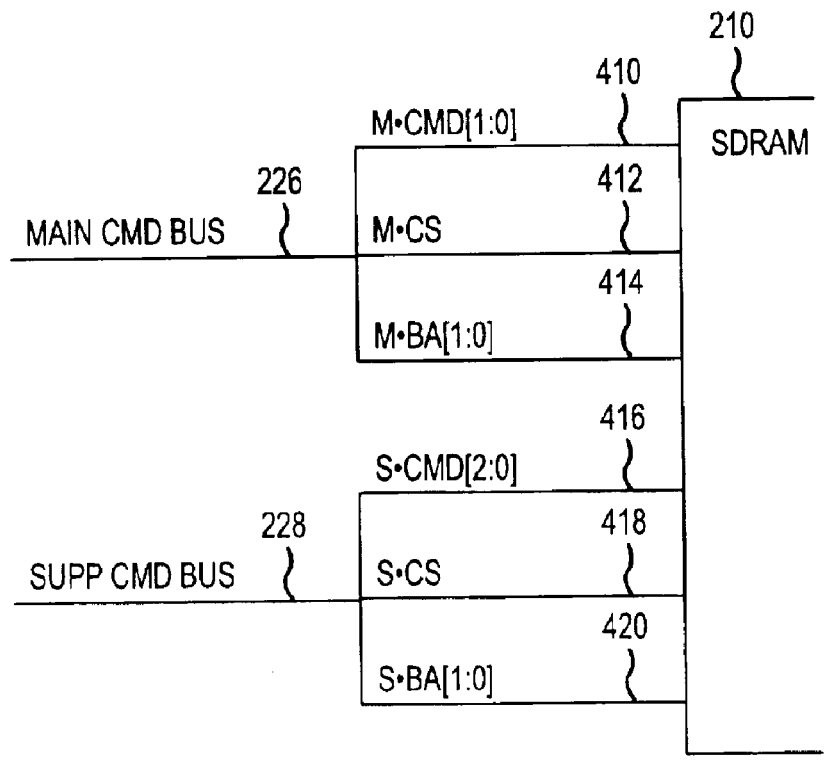
FIG. 6 is another alternative embodiment of a main control bus and a supplementary control bus.

In alternative embodiments, the number of pins may be reduced by reconfiguring the command set and the main and supplementary command buses 226, 228 and the interface 250. For example, the commands may be apportioned such that commands not requiring the address bus 224 are asserted only on the supplementary control bus 228. Thus, in the present embodiment, the main control bus 226 may be configured to handle only three commands (ACTIVE, READ, and WRITE), requiring only two command bits, as illustrated in FIG. 6.

Figure 7:
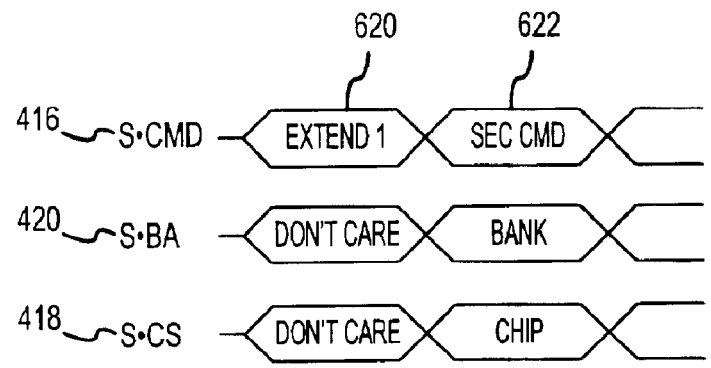
FIG. 7 is a timing diagram for providing a secondary command indicator.

In another embodiment, the number of bits required by the supplementary control bus 228 may be reduced by packetizing various commands. Packetizing comprises sending consecutive signals for a single command, such as for lower priority commands. For example, referring to FIG. 7, the supplementary control bus 228 may be configured with two supplementary command bits 416 as well as the supplementary chip select 418 and supplementary bank select bits 420. The supplementary command bits 416 may receive one of four main commands. Three commands are suitably executable commands, such as PRECHARGE, AUTO REFRESH, and NOP. The fourth command may be a secondary command indicator 620, referred to in this embodiment as EXTEND1. EXTEND1 designates a secondary command 622 following, for example, in the next cycle. Thus, if EXTEND1 is transmitted, the next cycle contains the secondary command 622. The secondary commands may comprise any appropriate commands, such as SELF REFRESH, WAKE, or LOAD MODE. In the present embodiment, the secondary commands comprise commands that are lower priority than the main commands. The main and secondary command sets may be selected, however, according to any desired criteria.

Figure 8:
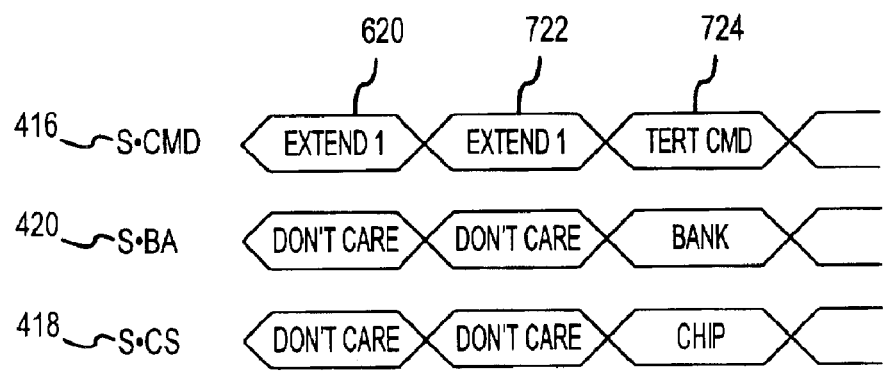
FIG. 8 is a timing diagram for providing a tertiary command indicator.
Figure 9:
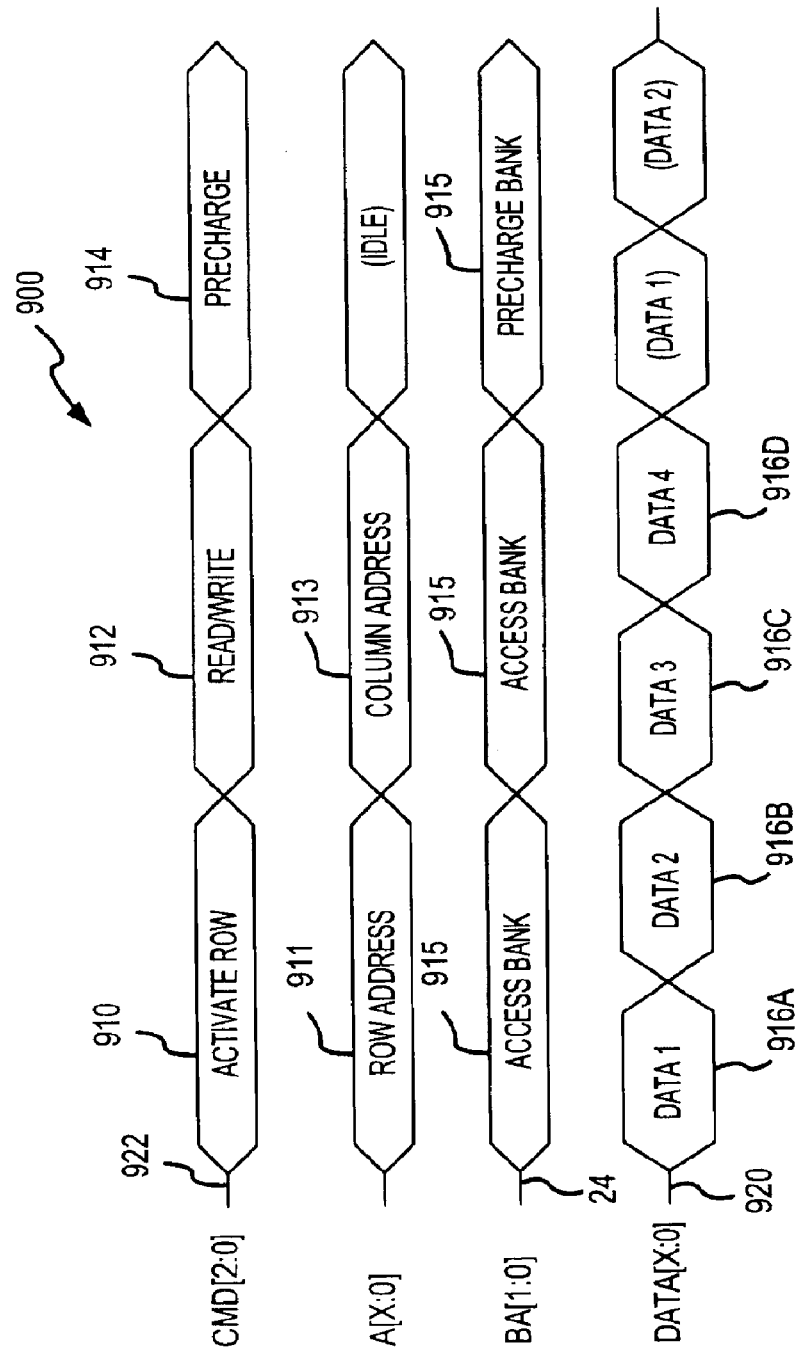
FIG. 9 is a timing diagram for a simplified, illustrative prior art memory access.

Further, referring to FIG. 8, the secondary command 722 may indicate another command following, such as in the next cycle, by asserting a tertiary command indicator 724 (EXTEND2). The tertiary command 724 may then be asserted in the following cycle. Additional command capability may be provided using additional sub-command indicators if desired. Thus, many low priority commands may be added without adding additional command bits.

It should be appreciated that the particular implementations shown and described herein are illustrative of the invention and its best mode and are not intended to otherwise limit the scope of the present invention in any way. Indeed, for the sake of brevity, conventional signal processing, data transmission, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A method for accessing a memory comprising the steps of:
   asserting a first signal on a supplementary chip select bus, wherein assertion of the first signal on the supplementary chip select bus executes a supplementary command on a first memory bank, wherein the first memory bank is designated by the first signal on the supplementary chip select bus and a second signal on a supplementary bank select bus; and
   asserting, via a main command bus, a main command on the first memory bank.

2. The method of claim 1 further comprising the steps of:
   asserting, via a main command bus, one of a READ command and a WRITE command on the first memory bank, wherein the one of said READ command and WRITE command are asserted in association with an address communicated via an address bus.

3. The method of claim 2 further comprising the steps of:
   asserting, via said main command bus, the main command on a second memory bank concurrently with assertion, via the supplementary chip select bus, of the supplementary command on the first memory bank.

4. The method of claim 3 wherein the supplementary command comprises one of a PRECHARGE and PRE-ACCESS command.

5. The method of claim 3 wherein the main command comprises an ACTIVE command.

6. A method for accessing a memory comprising the steps of:
   asserting a signal on a supplementary command bus, wherein assertion of the signal on the supplementary command bus executes a supplementary command on a first memory bank; and
   asserting, via a main command bus, a main command on the first memory bank.

7. The method of claim 6 further comprising the steps of:
   asserting, via a main command bus, one of a READ command and a WRITE command on the first memory bank, wherein said one of the READ command and WRITE command are asserted in association with an address communicated via an address bus.

8. The method of claim 6 further comprising the steps of:
   asserting, via the main command bus, the main command on a second memory bank; and
   concurrently asserting, via the supplementary control bus, a PRECHARGE command on said first memory bank.

9. The method of claim 8 wherein the supplementary command comprises one of a PRECHARGE and PRE-ACCESS command.

10. The method of claim 8 wherein the main command comprises an ACTIVE command.

11. A method for accessing a memory comprising the steps of:
    activating rows and select columns for memory access operations using a main control bus; and
    closing banks of memory using a supplementary control bus.

12. The method of claim 11 wherein the activating step further comprises the steps of:
    identifying a first memory location on a first memory bank based on first signals from a main bank select bus, a main chip select bus, and an address bus;
    providing an ACTIVE signal, on the main command bus, at a first time;
    identifying a second memory location on a second memory bank, wherein the second memory location is identified by second signals from the main chip select bus, main bank select bus, and address bus; and
    providing one of a READ command and a WRITE command to the second memory location at a second time.

13. The method of claim 12 further comprising the step of providing a supplementary command, on a supplementary command bus, to the first memory bank at the second time.

14. The method of claim 13 wherein the supplementary command is a PRECHARGE command and wherein the PRECHARGE command closes a still-active row from the preceding memory access operation.

15. The method of claim 13 wherein said supplementary command comprises a NOP command, delivered via a supplementary control bus at the first time.

16. The method of claim 13, wherein said supplementary command comprises one of the following commands: DESELECT, NO OPERATION, BURST TERMINATE, PRECHARGE, AUTO REFRESH, and LOAD MODE REGISTER.

17. A method for accessing a memory comprising the steps of:
    asserting a first signal on a supplementary command bus, wherein assertion of the first signal on the supplementary command bus executes a supplementary command on a first memory bank, wherein the step of asserting the first signal on the supplementary command bus further comprises packetizing of the supplementary command; and asserting, via a main command bus, a main command on the first memory bank.

18. The method of claim 17, wherein the step of packetizing comprises sending consecutive signals for a single, lower priority command, and wherein the supplementary control bus is configured with two supplementary command bits, a supplementary chip select bit, and supplementary bank select bit.

19. The method of claim 18, wherein the supplementary command bus is configured to receive at least one of executable commands PRECHARGE, AUTO REFRESH, and NOP, and secondary command indicator EXTEND1, wherein EXTEND1 designates a secondary command to be performed in a subsequent cycle, and wherein upon assertion of EXTEND1, the next cycle contains the secondary command.

20. The method of claim 19 wherein EXTEND1 comprises one of: SELF REFRESH, WAKE, and LOAD MODE.

21. The method of claim 19, wherein the secondary command is a command that is lower in priority than the main commands.

22. The method of claim 17 further comprising the steps of:

asserting, via a main command bus, one of a READ command and a WRITE command on the first memory bank, wherein said one of the READ command and WRITE command are asserted in association with an address communicated via an address bus;

asserting, via said main command bus, the main command on a second memory bank; and concurrently asserting, via the supplementary command bus, a PRECHARGE command on said first memory bank.

23. The method of claim 20 wherein the supplementary command comprises one of a PRECHARGE and PRE-ACCESS command.

24. The method of claim 20 wherein the main command comprises an ACTIVE command.

25. The method of claim 19 further comprising the steps of:

asserting a tertiary command.

26. The method of claim 25, wherein the secondary command is a tertiary command indicator, and wherein the tertiary command indicator indicates another command following, in a subsequent cycle, and wherein a tertiary command is asserted in the following cycle.

* * * * *